(12) United States Patent
Matsuno et al.

(10) Patent No.: US 6,512,297 B2
(45) Date of Patent: *Jan. 28, 2003

(54) CVD SOURCE MATERIAL FOR FORMING AN ELECTRODE, AND ELECTRODE AND WIRING FILM FOR CAPACITOR FORMED THEREFROM

(75) Inventors: Shigeru Matsuno, Tokyo (JP); Fusaoki Uchikawa, Tokyo (JP); Takehiko Sato, Tokyo (JP); Akira Yamada, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/277,185

(22) Filed: Mar. 26, 1999

(65) Prior Publication Data
US 2001/0050391 A1 Dec. 13, 2001

(30) Foreign Application Priority Data
May 7, 1998 (JP) ............................................ 10/124726

(51) Int. Cl.[7] ............................................ C23C 16/00
(52) U.S. Cl. ....................... 257/768; 427/250; 427/252; 427/255.14; 427/255.6; 505/447
(58) Field of Search ..................... 257/306, 310, 257/383, 632, 642, 741, 768, 769; 427/248.1, 250, 252, 255.14, 255.19, 255.6, 255.21; 505/447

(56) References Cited

U.S. PATENT DOCUMENTS

| 4,915,988 A | * | 4/1990 | Erbil ........................... 427/252 |
| 4,916,828 A | * | 4/1990 | Yamane et al. ................. 34/10 |
| 4,927,670 A | * | 5/1990 | Erbil ......................... 427/255.3 |
| 4,943,673 A | * | 7/1990 | Norman et al. ............. 585/845 |
| 4,950,790 A | * | 8/1990 | Norman ....................... 564/278 |
| 5,008,415 A | * | 4/1991 | Norman ......................... 556/32 |
| 5,085,731 A | * | 2/1992 | Norman et al. ............. 156/646 |
| 5,098,516 A | * | 3/1992 | Norman et al. ................ 216/78 |
| 5,130,172 A | * | 7/1992 | Hicks et al. ................. 427/252 |

(List continued on next page.)

FOREIGN PATENT DOCUMENTS

| JP | 4-214867 | 8/1992 |
| JP | 8-283945 | 10/1996 |
| JP | 8-306627 | 11/1996 |
| JP | 9-27602 | 1/1997 |
| JP | 9-235287 | 9/1997 |
| JP | 9-287075 | 11/1997 |

OTHER PUBLICATIONS

Aldrich Chemical Co., Inc., 1996 catalog.*
Alfa Research Chemicals and Accessories, 1993–1994 catalog.*
Alfa Aesar website document, May 2001.*
Matsuno et al, "Metalorganic Chemical Vapor Deposition Using A Single Solution Source For High $J_c Y_1 Ba_2 Cu_3 O_{7-x}$ Superconducting Films", *Appl. Phys. Lett.* 60 (*19*), May 11, 1992, pp. 2427–2429.

Primary Examiner—Matthew Smith
Assistant Examiner—Lex H. Malsawma
(74) Attorney, Agent, or Firm—Leydig, Voit & Mayer, Ltd.

(57) ABSTRACT

A CVD source material which can be stably transported to a reactor in order to form a platinum metal, Cu, or an oxide of them as an electrode. An organometallic compound including a platinum metal (Ru, Pt, Ir, Pd, Os, Rh, Re) or Cu, is dissolved into tetrahydrofuran or a solvent containing tetrahydrofuran to obtain the CVD source material. In this material, the amount of moisture is preferably not more than 200 ppm. A film is formed by CVD employing this source material, the material is supplied stably, and the properties of the electrode film are improved. The capacitance property of the film is improved. Wiring of an electrical device may be formed by employing source material.

10 Claims, 1 Drawing Sheet

U.S. PATENT DOCUMENTS

| | | | |
|---|---|---|---|
| 5,144,049 A | * 9/1992 | Norman et al. | 556/12 |
| 5,187,300 A | * 2/1993 | Norman | 556/12 |
| 5,316,796 A | 5/1994 | Awaya et al. | |
| 5,372,850 A | 12/1994 | Uchikawa et al. | 427/255.3 |
| 5,374,760 A | * 12/1994 | Kobayashi | 556/448 |
| 5,403,620 A | * 4/1995 | Kaesz et al. | 427/252 |
| 5,462,014 A | 10/1995 | Awaya et al. | |
| 5,555,154 A | 9/1996 | Uchikawa et al. | 361/322 |
| 5,629,229 A | 5/1997 | Si et al. | |
| 5,648,114 A | * 7/1997 | De Araujo et al. | 427/126.3 |
| 5,717,234 A | 2/1998 | Si et al. | |
| 5,820,664 A | * 10/1998 | Gardiner et al. | 106/287.17 |

* cited by examiner

FIG. 1

CVD SOURCE MATERIAL FOR FORMING AN ELECTRODE, AND ELECTRODE AND WIRING FILM FOR CAPACITOR FORMED THEREFROM

BACKGROUND OF THE INVENTION

The present invention relates to a raw material of a chemical vapor deposition (hereinafter referred to as "CVD") for forming an electrode or a wiring film that is employed in a dielectric memory such as Dynamic Random Access Memory (hereinafter referred to as "DRAM"), or ferroelectric Random Access Memory (hereinafter referred to as "FeRAM"), or as a dielectric filter of an electronic device, and it also relates to an electrode and a wiring film that are formed thereof.

Recently, a high integration of memory device in the semiconductor has been rapidly advancing. Progress in view of the high integration of, for instance, DRAMs resulted in a bit number that was four times larger than three years ago. This progress has been made in order to obtain an device having high speed processing, low consumption of electricity and low cost. However, a capacitor as for a component of a DRAM must have a specific capacitance, in spite of improvement in the integration of the device. Therefore, to secure the required capacitance has been investigated by various methods, for instance, decreasing the film thickness of material for capacitor, improving the permittivity by changing materials, or increasing the effective area by employing a three-dimensional shape, etc.

On the other hand, according to the high-performance of a semiconductor device and the like, it has become necessary to achieve a low resistance of an electrode or a wiring film employed therein and to achieve an affinity with the material of a capacitor or the material of a substrate. Instead of Al that has been generally employed as a material for forming an electrode in the conventional art, there have been employed Cu, Ir, Ru, Pt or, if necessary, an oxide thereof, as a material for forming an electrode and wiring.

Properties required for an electrode material are excellent electric properties of the obtained electrode, namely, small electrical resistance, and it is also important to have a required performance such as a favorable affinity with a dielectric material of a capacitor or with a material of a substrate thereon, and to be formed on a substrate of complicated shape.

For instance, in order to form an electrode as a thin film onto a capacitor of a stepped DRAM, it is necessary to have a favorable coverage of an object of complicated shape. In case of an electrode employed as a capacitor employing an oxide as a dielectric, it is necessary to prevent a decrease in property of the dielectric, and to have the favorable affinity between the dielectric and the electrode. For instance, in a capacitor of (Ba, Sr) TiO$_3$ or Sr—Bi—Ta—O, a metal of the platinum group such as Pt, Ru or Ir may be employed, and the interface between the dielectric and the electrode is preferably made of a conductive material of the oxide group such as RuO$_2$ or IrO$_2$.

On the other hand, since the wiring material may be required, depending on the application thereof, to have a lower electric resistance than that of a conventional material such as Al, is attractive Cu, and development has been made in the field of Cu wiring technique. Mostly, of the film forming process for the electrode is sputtering, and it has partially been considered to employ a CVD method for Cu and the like.

Under these circumstances, though it is most advantageous to form a film through the CVD method, there is currently a large problem that there are no materials which present stable and favorable evaporating properties as the CVD source material. This is mostly due to the fact that the evaporating properties of dipivaloylmethane (DPM) compounds of the β-diketone group, mainly employed as the CVD material, are not favorable. This is also mentioned, for instance, in Lecture Number 9a-P- 11 of the Collection of Preparatory Drafts of the 52nd Applied Physics Academy Science Meeting, and is considered to be a problem owing to the essential instability of metallic DPM compounds. Nevertheless, the CVD method has been actively investigated, and there are also reported extreme cases in which the material is wasted after employing it once due to the above described instability of the material. In only case of Cu, materials with a relatively high vapor pressure have been developed, but they present a problem that the material contains fluorine in it or it lacks stability.

Therefore, there are no known techniques for manufacturing a film for an electrode, which has favorable performance and repeatability of manufacturing that overcome these problems owing to the above described material (raw material), and thus these materials need to be developed.

Japanese Unexamined Patent Publication No. Hei.-9-82907 discloses, as an example of the above described conventional art, a problem presented in case that the conventional metal film of Pt or the like was formed as an electrode film, namely, a decrease in permittivity and a generation of leak current according to decreasing the thickness of the capacitor film. As a method for solving this problem, it has been suggested to specify a site of Ba, Sr, Ti, and to form a (Ba, Sr) TiO$_3$ film with a metal oxide as a main component through a sputtering method, which has a perovskite crystal structure of ABO$_3$ type. The film contains approximately 1% by weight of Fe and has a thickness of approximately 20 nm.

Japanese Unexamined Patent Publication No. Hei. 8-288242 relates to the formation of Cu film through the CVD method, and it discloses a device in which plural supplying pipes can be sequentially employed as a measure against clogging of pipes that is apt to occur when supplying a Cu raw material. It also discloses a method in which an organic metal is dissolved in a suitable solvent as a Cu source material.

Further, Japanese Unexamined Patent Publication No. Hei. 9-27602 discloses forming of a (Ba$_{1-x}$,Sr$_x$)RuO$_3$ film through the sputtering method as an electrode in case of employing (Ba$_{1-x}$Sr$_x$)TiO$_3$ as a capacitor film, and it also refers to a CVD material containing Ru(C$_5$H$_5$)$_2$ that is employed by dissolving in a solvent.

Formation of film for electrode had conventionally been performed in the above manner, and since forming of film disclosed in the Japanese Unexamined Patent Publication No. Hei. 9-82907 had been performed through the sputtering method, there were still presented problems that the film had a poor coverage property, and that forming onto a capacitor of complicated shape was difficult.

In the method disclosed in the Japanese Unexamied Patent Publication No. Hei. 8-288242, Cu was employed as the electrode film, and the stability was not yet sufficient also in the Cu organic metal compound as described herein. And low temperature decomposition is apt to occur even if it has a relatively high vapor pressure, so that the controllability at the film forming is inferior. Thus, the device and the film forming process have been devised to cope with this problem. Further, though it discloses that an organic metal compound is dissolved in a suitable solvent to obtain a Cu material, it does not refer to the effects thereof, that is, the stability or the controllability as a raw material.

Similarly, the Japanese Unexamined Patent Publication No. Hei. 9-27602 does not refer to a stable supply of the organic metal material.

As described so far, it was difficult to supply the CVD material to a CVD reaction portion stably (to perform a stable supply) through heating at a low temperature owing to the stability and the evaporating deficiency of the CVD material for forming an electrode film through the conventional CVD method. Thus, there was a large problem that an electrode film of desired material having favorable properties could not be formed stably. Further, in case of heating at a high temperature in order to improve the evaporating efficiency of the CVD material, the raw material was transported while undergoing pyrolysis, and the deficiency in film shape and the lag of film thickness with the pre-determined value could not be avoided.

Also, a conventional method presented problems that the film formation speed could not be stabilized in case the evaporating speed was suppressed and the synthesis (reaction) time was prolonged, since the stability of the material sequentially degraded and the evaporating property gradually decreased. Further, it was impossible to avoid an increase in resistance in case of forming a complex conductive oxide film, since the composition in the film thickness direction became irregular. Therefore, there has been strongly desired a CVD source material which presents a stable evaporation even after a multiple or a long-term use and a favorable evaporating property even at a low temperature, as the CVD source material containing the desired metal for forming various required electrode films. But no materials are available that sufficiently satisfy the above requirements, while various raw materials are presently suggested.

SUMMARY OF THE INVENTION

The present invention has been made for solving the above problems of the conventional material that had been employed in the conventional CVD method so far, and the present invention has made it possible to stably transport (supply) the material for forming an electrode of platinum group metals, Cu or an oxide thereof to a reaction portion, and to form an electrode thin film of favorable performance at high repeatability owing to the stable transportation. It has also made it possible to improve the coverage property to an object of complicated shape.

The electrode film formed by the present invention is applicable to not only semiconductor but also wiring of other electric devices.

According to one aspect of the present invention, there is provided a CVD material for forming an electrode, in which at least one organic metal compound, of which metal is a platinum group metal or Cu, is dissolved in tetrahydrofuran.

Another aspect of the present invention, there is provided a CVD material for forming an electrode, in which at least one organic metal compound, of which metal is a platinum group metal or Cu, is dissolved in a solvent containing tetrahydrofuran.

Preferably, the amount of moisture is not more than 200 ppm.

Preferably, the organic metal compound is an complex organic metal compound containing plural metal elements, and that the metal elements of the organic metal complex compound are at least one metals selected from the group consisting of Ru, Pt, Ir, Pd, Os, Rh, Re and Cu.

Preferably, the organic metal compound is a compound in which a metal atom is combined with an organic group through an oxygen atom.

Preferably, the compound in which the metal atom has combined with the organic group through the oxygen atom is acetylacetonato, dipivaloylmethanato, alkoxide, hexafluoroacetylacetonato, pentafluoropropanoylpivaloylmethanato or a derivative thereof of any one of the metal selected from the group consisting of Ru, Pt, Ir, Pd, Os, Rh, Re and Cu.

Preferably, the compound in which the metal atom has combined with the organic group through the oxygen atom is a dipivaloylmethanato group compound of the metals selected from the group consisting any one of Ru, Pt, Ir and Cu.

Preferably, the organic metal compound is cyclopentadienyl or a derivative thereof of any of the metals selected from the group consisting of Ru, Pt, Ir, Pd, Os, Rh, Re and Cu.

Another aspect of the present invention, there is provided an electrode for a capacitor which is formed with the CVD material for forming an electrode through the CVD method.

Another aspect of the present invention, there is provided a wiring film which is formed with the CVD material for forming an electrode through the CVD method.

The inventors have achieved the present invention through detailed considerations by evaluating evaporating properties of solid type DPM compounds mostly employed in the conventional CVD method, and further evaluating properties of electrode film formed by employing the mentioned material and the process at forming.

DETAILED DESCRIPTION

Embodiment 1

In the first embodiment of the present invention, Cu or a platinum group metal such as Ru, Pt, Ir, Pd, Os, Rh, or Re is selected as the material for an electrode, and various organic metal compounds containing these metal elements were dissolved into tetrahydrofuran to obtain the CVD material. An electrode film formed by employing it, had a resistance lower than that of conventional ones and presented favorable properties, and the material was supplied stably at film forming. At this time, in case the amount of moisture contained in the material solution was set not more than 200 ppm, the stability of the material supply was further improved, and the properties of the film were also improved.

It has become evident through subsequent considerations that there were two sorts of influence of moisture contained in the solution. The first influence relates to an evaporation of a material, and it causes generation of unevaporated residues through reaction with the material, and it further causes generation of resolving products during the transportation of a material gas. These badly affect the film properties and the coverage property of the electrode. The second influence relates to storage stability of the material, and it gradually generates resolving products in the material solution tank at a relatively low temperature, below the evaporation temperature, and over a long term. This badly affects the film properties and the coverage property of the electrode as well, and also causes blockages in the solvent supply system. Thus, the amount of moisture in the material solution is preferably small. As the metal organic compound, there may be employed, while some of them are at the stage of study, acetylacetonato, dipivaloylmethanato, alkoxide, hexafluoroacetylacetonato, pentafluoropropanoylmethanato, cyclopentadienyl or a derivative thereof and at least one metal selected from the group consisting of Ru, Pt, Ir, Pd, Os, Rh, Re and Cu.

Embodiment 2

In the second embodiment of the present invention, Cu or a platinum group metal such as Ru, Pt, Ir, Pd, Os, Rh or Re is selected as a material for the electrode, and various organic metal compounds containing these metal elements were dissolved in a solvent containing tetrahydrofuran to obtain the CVD source material. The material contains tetrahydrofuran as a main component and investigations have been made by adding various solvents to it, to find out that tetraetyleneglycol, dimethyl ether, diethyl ether, cyclohexanone and the like were compatible with tetrahydrofuran, and the same effects as in Embodiment 1 could be obtained. Namely, in forming an electrode film employing them, the resistance thereof was lower than that of conventional ones and presented favorable properties, and the material was supplied stably at film forming. At this time, in case the amount of moisture contained in the material solution was set to not more than 200 ppm, the stability of the material supply was further improved, and the properties of the film were also improved, as in the case of Embodiment 1.

As the metal organic compound, there may be employed acetylacetonato, dipivaloylmethanato, alkoxide, hexafluoroacetylacetonato, pentafluoropropanoylmethanato, cyclopentadienyl or a derivative thereof and at least one metal selected from the group consisting of Ru, Pt, Ir, Pd, Os, Rh, Re and Cu, while some of them are at the stage of study.

In the above described Embodiments 1 and 2, it is possible to dissolve more than two sorts of organic metal compounds to tetrahydrofuran or a solvent containing tetrahydrofuran to obtain the material for forming an electrode film of complex oxide groups.

Further, in the above described Embodiments 1 and 2, it is also possible to select, as the organic metal compound, an organic metal complex compound containing at least one metal element selected from the group consisting of Ru, Pt, Ir, Pd, Os, Rh, Re and Cu, and to dissolve them in tetrahydrofuran or a solvent containing tetrahydrofuran to obtain the source material for forming an electrode film of complex oxide groups.

In forming a film for an electrode and wiring portions for an electronic device other than a semiconductor device by employing the CVD material based on the above described Embodiments 1 and 2, it was possible to form a film stably which presented favorable properties.

Possibility for application of the electrode and the wiring according to the present invention are shown in Table 1.

TABLE 1 material form and characteristics

| purpose | electrode and wiring material form | characteristics |
|---|---|---|
| reducing resistance | metal | simple composition |
| improving a | metal | simple composition |
| coverage property | oxide | a barrier layer is needed depending on the composition |
| improving an affinity | oxide | a barrier layer is needed depending on the composition |
|  | complex oxide | increasing the number of element |
| compatible with the plural purposes | alloying | increasing the number of process and the number of element |
|  | lamination of metal, oxide, complex oxide or the like | increasing the number of process and the number of element, a barrier layer is needed depending on the composition |

The present invention will now be further explained in details based on the Examples concretely.

EXAMPLE 1

Figure 1:
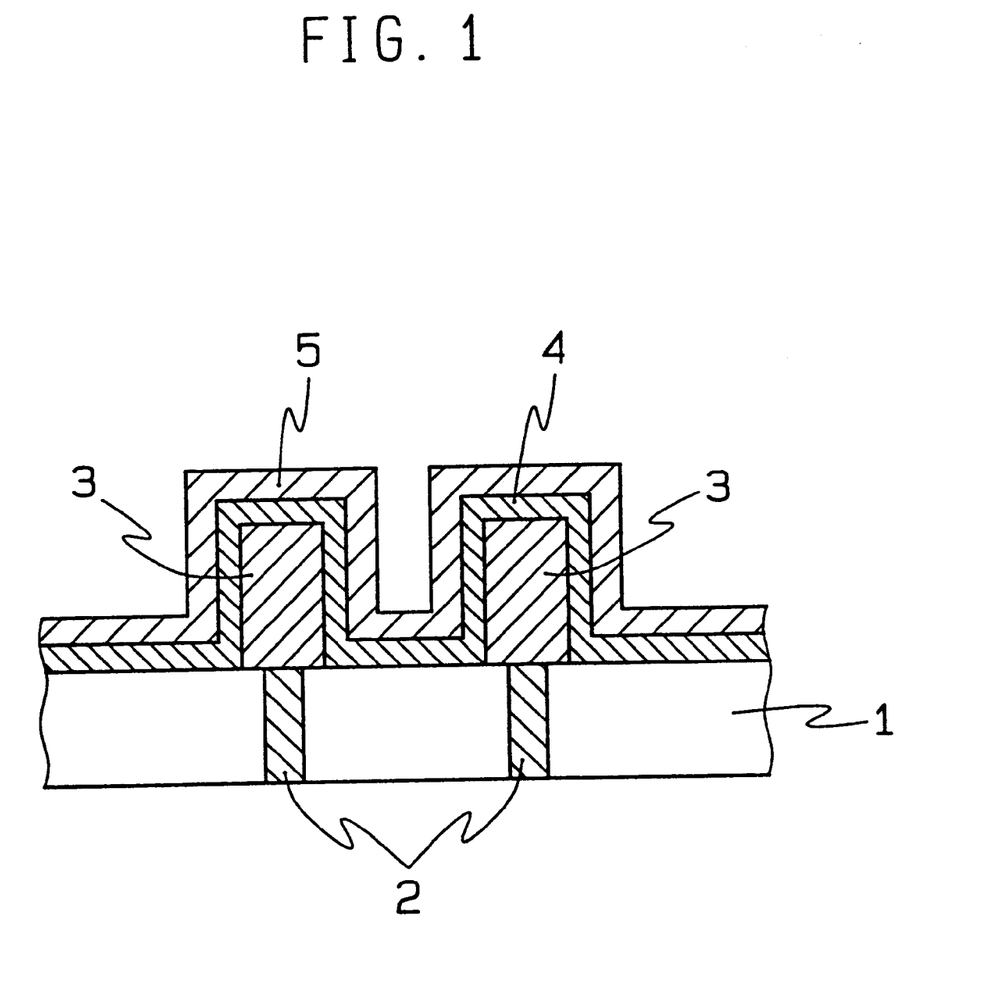
FIG. 1 is a sectional view that shows one example of a semiconductor device employing an electrode made of the CVD raw material of the present invention.

FIG. 1 is a structural view showing an example of a semiconductor device (memory) employing an electrode according to Embodiment 1 of the present invention. 1 denotes an insulator substrate layer, 2 a conductive plug, 3 a lower electrode, 4 a capacitor film, and 5 an upper electrode. In the semiconductor device, an electrical charge is stored in the capacitor film 4 between the lower electrode 3 and the upper electrode 5, and the basic units thereof are integrated, of which the number corresponds to a finally required memory capacity.

An arrangement of Example 1 is explained below, in which Ru is employed for the lower electrode 3 and the upper electrode 5. Firstly, a foundation material was prepared in which a conductive plug 2 was embedded in the insulator substrate layer 1. This was made by forming holes in an insulator substrate layer of silicon dioxide through a photomechanical etching, and embedding polysilicon as a conductive plug 2 through the CVD method. It should be noted that these arrangements of the material and the method of forming are mere examples, and there may be employed various arrangements of material and various methods of forming. While below the insulator substrate layer there are preliminarily formed various arrangements for transistors or wirings, any descriptions related to their structure or manufacturing methods are omitted here. Over the whole surface of the foundation material, a Ru metal layer which served as a base for the lower electrode was formed by employing the CVD source material according to the present invention through the CVD method, and was thereafter processed into a desired shape through a photomechanical and etching treatment. On the lower electrode, BST ((Ba, Sr)TiO$_3$) was formed as a capacitor film through the CVD method. And, over the whole upper surface, Ru was formed as the upper electrode by employing the CVD source material according to the present invention through the CVD method. In this manner, the semiconductor device having an arrangement shown in FIG. 1 was manufactured.

The CVD material employed in this Example was a solution, in which Ru(DPM)$_2$ (dipivaloylmethanato metal complex of Ru) was dissolved in THF (tetrahydrofuran) as an organic solvent by adjusting to a concentration of 0.1 mol/L. This concentration of solution is not limited as long as it does not exceed the limit of the solubility of the complex, and may be suitably determined in view of the required film forming speed etc. Film forming can be carried out by providing this raw material solution to a conventional CVD device for a raw material solution. Such a CVD device is disclosed, for instance, in Japanese Unexamined Patent Publication No. Hei. 6-310444 by the present Applicants. After forming the foundation structure and attaching it to the CVD device, film forming was performed for 30 minutes under the following conditions: a solution supply amount of 1 ml/min, an evaporation temperature of 120° C., a film forming pressure of 10 Torr, and a film forming temperature of 460° C. Consequently, a Ru metal film having a film thickness of 300 nm was obtained. After processing this film into the above described shape, BST having a film thickness of 30 nm was formed through the CVD method, and a Ru film was formed on the upper portion thereof for 5 minutes under the same conditions as for the lower electrode, to atmosphere, and the film properties may be changed accordingly, on occasion. Therefore, it is necessary to suitably select film forming conditions by considering the condition of the foundation.

On the other hand, it has been found through subsequent considerations that the raw material for solution as employed in the present Example shows differences in the resistance, the coverage property of the film and the stability of the raw material, depending on the amount of the moisture contained in the final solution at the preparation. Table 2 shows the properties of electrodes formed through the CVD method by employing the raw materials having a different amount of moisture, and the properties of electrodes formed through the CVD method and the sputtering method as a comparative example in which the metal complexes are employed in solid state.

TABLE 2

|  | raw material | amount of moisture (ppm) | specific resistance (compared with the natural property) | coverage property | stability |
| --- | --- | --- | --- | --- | --- |
| present invention | CVD $Ru(DPM)_2$ + THF (solution) | 100≧ | excellent | excellent | excellent |
|  | CVD $Ru(DPM)_2$ + THF (solution) | 100–200 | good | pretty good | pretty good |
|  | CVD $Ru(DPM)_2$ + THF (solution) | 200≦ | good | good | good |
| conventional method | CVD $Ru(DPM)_2$ | — | bad | bad | extremely bad |
|  | sputtering $Ru(DPM)_2$ | — | good | extremely bad | — | obtain the upper electrode of Ru metal film having a film thickness of 30 nm. It was found that the upper electrode presented a quite favorable coverage property to side wall portions of 80% despite the fact that the foundation thereof was a three-dimensional structure. The coverage property is expressed by a ratio of film thickness between a side wall portion of a stepped portion and an upper portion. And the closer this value becomes to 100%, the more excellent the property becomes. This property is one of the greatest features of the CVD method, but the property is affected largely depending on the raw material, and the material for the solution employed in this Example especially resulted in a favorable value thereof. For instance, in case of cyclopentadiene of $Ru_2(Ru(C_5H_5)_2)$, dissolved in into THF, the coverage property was 60%. The resistance of the Ru electrode obtained in the present invention was a favorable value which was close to the original value.

In this Example metal has been generated through pyrolysis of the raw material itself, a metal film having a lower resistance can be obtained and the film forming speed can also be improved by adding a reducing gas such as hydrogen at film forming. On the other hand, there may occur problems in which the decomposed C (Carbon) is trapped in the metal film, and, in case that the foundation is an oxide such as BST the interface is reduced and the capacitor properties are decreased. During the material transportation process, it is also possible to employ an inert gas such as He, Ar, or a gas such as $N_2$ which is inert in this film forming condition as a transportation gas (carrier gas). This means changing the partial pressure of the raw material in the film forming It is apparent from this table that most favorable values can be obtained in case the amount of moisture of the solution is in the range of 100 to 200 ppm, and not more than 100 ppm is more preferable. It has further been found that the conventional CVD method and the sputtering method, in which the solid CVD materials are employed as they are, have problems in the stability and the coverage property of the material, and the predominance of the present invention is recognized.

This is due to the fact that the amount of moisture contained in the material has been provided to solve the problems that the unevaporated residue was generated through reaction with the raw material, the resolving product was generated during the transportation of a raw material gas, and the resolving product was gradually generated in the material solution tank at a relatively low temperature under the evaporating temperature and over a long term. Further, it has also been provided to solve problems such as a decrease in the film properties and the coverage property of the electrode as well as a blockage of the solution supply system due to an influence of moisture. Thus, the amount of moisture contained in the raw material solution is preferably small.

In addition to an oxide of Ru employed in the present example, it is also possible to alternatively employ a metal of the platinum group (Pt, Ir, Pd, Os, Rh, Re) or Cu as the metal for the electrode. In this case, an organic metal and a metal complex that can be dissolved in the employed solution are suitably selected. It is also possible to employ different materials for the upper electrode and the lower electrode, and the combination thereof is not limited unless both of them are selected from the metals of the platinum group (Pt, Ir, Pd, Os, Rh, Re) and Cu. In this Example, the lower electrode was formed through the CVD method, but it is also possible to form the lower electrode through the sputtering method, since it is not required to show a good coverage property. However, in case of Cu, the oxide of which has a high resistance, it may be necessary, depending on film forming conditions, to employ a barrier layer for oxidation in the interface between the lower electrode and the capacitor layer, so that it is applied only in a case in which a change in a resistance of an electrode is especially important.

While Ru(DPM)$_2$ was employed as the raw material compound in the present Example, there can be alternatively employed acetylacetonato, alkoxide, hexafluoroacetylacetonato, pentafluoropropanoylmethanato or cyclopentadienyl of a metal or a derivative thereof. As the alkoxide, there may be employed methoxide, ethoxide, isopropoxide or the like. In case that either of them is employed, it may be dissolved into tetrahydrofuran to obtain the raw material. However, it should be noted that the amount of moisture of the solution is in the range of 100 to 200 ppm to obtain an most favorable value, as in the case of Ru(DPM)$_2$, and not more than 100 ppm is more preferable.

As the solvent employed for the raw material of solution, pure THF is preferable. However, according to a synthesizing method of an organic metal, a metal complex and the like, the solution may contain a solvent other than THF, which is the solvent employed at preparation. As this solvent, examples are, for instance, tetraethyleneglycol dimethyl ether (tetraglyme), cyclohexanone (anone), diethyl ether, toluene and the like. In view of this fact, a mixed solvent of THF and these solvents was prepared, and the organic metal and the metal complex were dissolved to obtain the raw material solution. And the applicability of the raw material of solution was investigated. It has been found that it could be applicable in case the ratio of THF contained in the mixed solvent was approximately not less than 30 wt %. It has further been found that the raw material of solution was also applicable in case that various organic solvents other than the above listed ones were added as long as the solvent presented compatibility as a whole. It is preferable that the ratio of THF is as high as possible, since the stability and the coverage property of the raw material tend to be slightly decreased. A most favorable value can be obtained in case the amount of moisture of the whole solution upon mixing is in the range of 100 to 200 ppm, as in the case of THF alone, and not more than 100 ppm is more preferable.

EXAMPLE 2

In case of platinum group elements (Pt, Ir, Pd, Os, Rh, Re), it is also possible to employ an oxide thereof as an electrode other than a pure metal. Since the capacitor material is especially made of an oxide, it may be advantageous that the electrode is made of oxide in view of the affinity at the interface between the electrode and the capacitor. However, in case that the conductive plug remarkably decrease its conductivity due to oxidation, or in case that the decrease can be estimated, it is required to form a barrier layer of oxidation made, for instance, of titanium nitride between the conductive plug and the lower electrode. An example is given, in which the upper electrode and the lower electrode are made of IrO$_2$ and the capacitor film is made of SBT(Sr—Ba—TaO) by employing the CVD raw material according to the present invention in the arrangement as shown in FIG. 1. As the raw material solution, a solution was employed, in which Ir(HFA)$_2$ was dissolved into THF as an organic solvent and adjusted to a concentration of 0.1 mol/L. This concentration of solution is not limited as long as it does not exceed the limit of the solubility of the complex, and may be suitably determined in view of the required film forming speed etc. The film forming conditions were as follows: an amount of a solution supply of 3 ml/min, an evaporation temperature of 100° C., a film forming pressure of 10 Torr, and a film forming temperature of 400° C., and oxygen was supplied as an oxidant at a flow rate of 500 to 1,000 ccm per minute. The film forming time for forming the upper electrode and the lower electrode was respectively 30 and 5 minutes. In this manner, electrodes having a thickness of 200 nm and 20 nm were respectively obtained. In forming films of metals and oxides, different values of the film forming speed were respectively obtained, which are considered to be due to differences in adhesion coefficients to the substrate resulting from the difference in reaction systems at the film forming. In case the electrode was made of an oxide, the film forming speed decreased but the coverage property to the substrate was improved to some extent compared with those made of metal.

On the other hand, it has been found through subsequent considerations that variations in the resistance of the film, the coverage property of the film and the stability of the material occur depending on the amount of moisture contained in the final solution at the preparation in case of the materials of solution as employed in the present embodiment. Table 3 shows the properties of electrodes formed through the CVD method by employing the raw materials having a different amount of mixture, and the properties of electrodes formed through CVD method and the sputtering method as a comparative purpose in which the metal complexes are employed in solid state. It has been found that almost favorable values can be obtained in case the amount of moisture of the solution is in the range of 100 to 200 ppm, and not more than 100 ppm is more preferable, if possible.

TABLE 3

|  | raw material | amount of moisture (ppm) | specific resistance (compared with the natural property) | coverage property | stability |
|---|---|---|---|---|---|
| present invention | CVD Ir(HFA)$_2$ + THF (solution) | 100≧ | excellent | excellent | excellent |
|  | CVD Ir(HFA)$_2$ + THF | 100–200 | good | pretty good | pretty good |

TABLE 3-continued

|  | raw material | amount of moisture (ppm) | specific resistance (compared with the natural property) | coverage property | stability |
|---|---|---|---|---|---|
|  | (solution) CVD Ir(HFA)$_2$ + THF | 200≦ | good | good | good |
| conventional method | (solution) CVD Ru(DPM)$_2$ | — | bad | bad | extremely bad |
|  | sputtering Ru(DPM)$_2$ | — | good | extremely bad | — |

Besides an oxide of Ir employed in the present Example, it is also possible to alternatively employ a metal of the platinum group (Pt, Ir, Pd, Os, Rh, Re) as the metal for the electrode. In this case, an organic metal and a metal complex that can be dissolved into the employed solution may be suitably selected. It is also possible to employ a different material for the upper electrode and the lower electrode, and the combination thereof is not limited unless both of them are selected from the oxide of a platinum group metal (Pt, Ir, Pd, Os, Rh, Re). While the lower electrode was formed through the CVD method in this Example, it is also possible to form a film through the sputtering method since the lower electrode is not required to show the coverage property.

The greater the affinity between the capacitor oxide material and the electrode oxide material is improved, the more similar their structures become. For instance, when BST or SBT (Sr—Ba—Tao) is employed as a capacitor material, a perovskite group complex conductive oxide is preferably employed, whose structure is similar with their structures. Examples thereof are (Ba, Sr)IrO$_3$, (Ba, Sr)RuO$_3$ and the like. It has been found through investigations that the capacitor properties were slightly improved when forming of IrO$_3$ or RuO$_3$ films could be made by simultaneously sending materials corresponding to Ba and Sr, by employing a hypermixed solution corresponding to plural elements, or by employing a raw material of solution of complex organic metal. Thus, it is appropriate to select a material for the electrode in view of the required properties of electrode and the required capacitor properties. For instance, as the method of sending materials corresponding to Ba and Sr, there may be employed a method in which the material of solution, obtained by dissolving a metal complex or an organic metal of DPM, HFA and cyclopentadienyl into an organic solvent, are separately evaporated. As the multi mixed solutions, examples are the solution obtained by dissolving the mixed material into the same solvent, the solution obtained by mixing solutions, or the solution obtained by mixing separate materials for solution just before the evaporator. In this case, if the respective solvents are compatible, and decomposition of materials through reaction do not occur in their mixed states, it is possible to employ the arbitrary combination of materials as a solute and a solvent. Further, as a method of employing a material solution of a complex organic metal, it is possible to employ the solution dissolving various organic metal compounds such as a complex alkoxide, a multi-combined ketone complex, a complex compound of alkoxide and ketone complex, or a complex alkyl metal, into an organic solvent. The advantage of this method is that these material solutions are generally more stable than the raw material solution of mixed solution, and that uniform alloy or complex oxides can be easily obtained.

Though Ir(HFA)$_2$ was employed as the raw material compound in the present Example, it is also possible to alternatively employ acetylacetonato, dipivaloylmethanato, alkoxide, pentafluoropropanoylmethanato or cyclopentadienyl of a metal or a derivative thereof. As the alkoxide, there may be employed methoxide, ethoxide, isopropoxide or the like. In case that either of them is employed, it may be dissolved into tetrahydrofuran to obtain the raw material. However, it should be noted that the amount of moisture of the solution is in the range of 100 to 200 ppm, and not more than 100 ppm is more preferable if possible, to obtain an almost favorable value.

As the solvent employed for the raw material of solution, pure THF is preferable. However, according to a synthesizing method of an organic metal, a metal complex and the like, the solution may contain a solvent except for THF, which is the solvent employed at the preparation. As this solvent, examples are, for instance, tetraethylene glycol dimethyl ether (tetraglyme), cyclohexanone (anone), diethyl ether, toluene and the like. In view of this fact, a mixed solvent of THF and these solvents was prepared and the organometals and the metal complex were dissolved into these solvents to obtain the raw material of solution, and the applicability of the raw material of solution were investigated. It has been found that it could be applicable if the ratio of THF contained in the mixed solvent was approximately not less than 30 wt %. It has further been found that the material of solution was also applicable in case that various organic solvents other than the above mentioned ones were added as long as the solvent presented compatibility as a whole. But it is preferable that the ratio of THF is as high as possible, since the stability and the coverage property of the raw material tend to be slightly decreased. A most favorable value was obtained in case the amount of moisture of the whole solution at mixing was in the range of 100 to 200 ppm, as in the case of pure THF, and not more than 100 ppm is more preferable.

EXAMPLE 3

An arrangement is explained below, in which both of the lower electrode and the upper electrode are formed of Ru, and in which Cu is further formed on the upper Ru electrode to decrease resistance. The same steps as described above were performed until forming the upper Ru electrode. And a Cu metal layer was formed over the whole surface of the upper electrode by employing the CVD material according to the present invention through the CVD method.

The CVD raw material employed in this Example was a solution in which Cu(DPM)$_2$ was dissolved into THF as an organic solvent to be adjusted to a concentration of 0.2 mol/L. After forming the foundation structure and attaching it to the CVD device, film forming was performed for 20 minutes under the following conditions to obtain a Cu metal film having 500 nm thickness: a solution supply amount of 3 ml/min, an evaporation temperature of 140° C., a film forming pressure of 10 Torr, and a film forming temperature of 500° C. It was found that the upper electrode presented quite favorable coverage property to side wall portions of 80 %, though the foundation thereof was a three-dimensional structure. The resistance of the Cu electrode obtained in the present invention was a favorable value close to the natural property value.

While metal was generated in this embodiment through a pyrolysis of the raw material itself, a metal film having a lower resistance can be obtained and the film forming speed can also be improved by adding a reducing gas such as hydrogen at the film forming. On the other hand, there may occur problems in which the decomposed C (Carbon) is trapped in the metal film. It is an effective measure to add a very small amount of oxygen or another oxidant at the film forming of the electrode, but this causes a film resistance increase. Thus, it is required to suitably select these film forming conditions according to the purpose.

It has been found through subsequent considerations that variations in a resistance, the coverage property and the stability of the raw material occur depending on the amount of moisture contained in the final solution at the preparation of the material of solution employed in the present Example. Consequently, it has been found that almost favorable value was obtained in case the amount of moisture of the solution was in the range of 100 to 200 ppm, and not more than 100 ppm was more preferable.

$Cu(DPM)_2$ was employed as the raw material compound in the present Example, except for the material it is also possible to alternatively employ acetylacetonato, alkoxide, hexafluoroacetylacetonato, pentafluoropropanoylmethanato, cyclopentadienyl of a metal or a derivative thereof. As the alkoxide, there may be employed methoxide, ethoxide, isopropoxide or the like. In case that either of them is employed, it may be employed by dissolving to tetrahydrofuran. However, if the amount of moisture in the solution is in the range of 100 to 200 ppm, it is possible to obtain an almost favorable value and not more than 100 ppm is more preferable, same as in the case of $Ru(DPM)_2$ in Example 1.

In the above described Examples 1, 2 and 3, it is also possible to dissolve two or more organic metal compounds of Ru, Pt, Ir, Pd, Os, Rh, Re and Cu in tetrahydrofuran or a solvent containing tetrahydrofuran to obtain a raw material for forming an electrode film of complex oxide.

As a method by employing multi mixed solution, examples are the solution obtained by dissolving a raw mixed material into the same solvent, the solution obtained by mixing ready solutions, or the solution obtained by mixing separate materials of solution just before the evaporator. In this case, if the respective solvents are compatible, and decomposition of material through reaction does not occur in a mixed state, it is possible to employ material and solution in an arbitrary manner.

In the above described Example 1, 2 and 3, it is preferable that an organic metal compound is changed to a complex organic metal compound, then to a complex organic metal compound containing at least one metal element selected from the group consisting of Ru, Pt, Ir, Pd, Os Rh, Re and Cu, and the compound is dissolved into tetrahydrofuran or a solvent containing tetrahydrofuran, to obtain the raw material for forming an electrode film of a complex oxide.

In case of employing a raw material solution of a complex organic metal, it is possible to employ, as a raw material, the material obtained by dissolving various organic metal compounds such as a complex alkoxide, a multi-combined ketone complex, a complex compound of alkoxide and a ketone complex into an organic solvent. The advantage of this method is that these material solutions are generally more stable than the material solutions of the mixed solution, and that it is easy to obtain a uniform alloy or a complex oxide.

As the solvent employed for the raw material of solution, pure THF is preferable. However, according to a synthesizing method of an organic metal or a metal complex and the like, the solutions may contain a solvent other than THF, which is the solvent employed at the preparation. As this solvent, examples are, for instance, tetraethylene glycole dimethyl ether (tetraglyme), cyclohexanone (anone), diethyl ether or toluene. In view of this fact, a mixed solvent of THF and these solutions was prepared, and the organic metal and the metal complex were dissolved into this mixed solvent to obtain the raw material of solution, and the applicability of the material of solution has been investigated. It has been found that they were applicable if the ratio of THF contained in the mixed solvent was not less than 30 wt %. It has further been found that the raw material of solution was applicable also in case that various organic solvents except for the above listed ones were added as long as the whole solvent presented compatibility. But it is preferable that the ratio of THF is as high as possible, since the stability and the coverage property of the raw material tend to be slightly decreased. A most favorable value can be obtained if the amount of moisture of the whole solution in the mixed solvents is in the range of 100 to 200 ppm, and not more than 100 ppm is more preferable, same as in the case of employing only THF.

It is possible to employ the electrode according to the present invention as an electrode employed in a wiring material of a semiconductor device and in an electric device. For instance, it is required in a semiconductor device such as a microprocessor to change a conventional Al wiring to Cu wiring for the sake of high performance. This is because high processing speed due to a decrease in RC delay owing to a low resistance, and improvement in reliability of wiring owing to high activation energy of self-diffusion can be realized by employing Cu as material for a wiring. In conventional methods β-diketone derivative complexes (such as $[(CF_3CO)_2CH]Cu(C_5H_{12}Si)$, hexafluoroacetylacetone trimethylvinylsilane copper) are mainly employed, which are liquid at a room temperature, but they present problems that the decomposing temperature is low and selective growth is difficult, they contain fluorine in their structure and may react with other portions, the material is slightly unstable, and they do not show a good step covering property. Therefore, the property can be improved by employing the solution of the present invention as the raw material. Especially, the step covering property can be remarkably improved by employing the material of the present invention.

On the other hand, an electrode for an electronic device may be employed as electrode of high frequency filter, for a comb-like electrode of SAW filter, or for a dielectric filter. In this case, employing the raw material of the present invention for forming the electrode in these devices is advantaged in that the coverage property makes it possible to employ the material as an embedding type electrode applicable to fine shape.

As described above, in the first CVD material for forming an electrode according to the present invention, since at least one organic metal compound of platinum group metals or Cu is dissolved in tetrahydrofuran, an electrode and a device wiring of metal or conductive oxide having excellent properties can be formed due to a stable supply of a material gas, a capacitor electrode of complicated shape can be formed due to an improvement in the coverage property at film forming, and an electrode film can be obtained that show a favorable affinity with the foundation material.

And an electrode film formed by employing it, has a resistance as low as the natural resistance of the metal or the conductive oxide, and its favorable affinity to a foundation material enables it to realize a capacitor for a various memory and electronic devices having excellent properties.

In the second CVD material for forming an electrode according to the present invention, since at least one organic metal compounds of platinum group metal or Cu are dissolved into a solvent containing tetrahydrofuran, an electrode and a device wiring of metal or conductive oxide having excellent properties can be formed due to a stable supply of a material gas, a capacitor electrode of complicated shape can be formed due to an improvement in the coverage property at film forming, and an electrode film can be obtained that show a favorable affinity with the foundation material.

And an electrode film formed by employing it is the film which has a resistance as low as the natural resistance of the metal or the conductive oxide, and its favorable affinity to foundation material enables it to realize a capacitor for a various memory and an electronic device having excellent properties.

In the first and second CVD material for forming an electrode according to the present invention, it has been provided that since the amount of moisture is not more than 200 ppm, an electrode and a device wiring of metal or conductive oxide having excellent properties can be formed due to a stable supply of a material gas, a capacitor electrode of complicated shape can be formed due to an improvement in the coverage property at film forming, and an electrode film can be obtained that show a favorable affinity with the foundation material.

And an electrode film formed by employing it is the film which has a resistance as low as the natural resistance of the metal or the conductive oxide, and its favorable affinity to foundation material enables it to realize a capacitor for a various memory and an electronic device having excellent properties.

In the first and second CVD material for forming an electrode according to the present invention, it has been provided that the organic metal compound is a complex organic metal compound including plural metal elements, that the metal elements in the complex organic metal composite are at least one metals selected from the group consisting of Ru, Pt, Ir, Pd, Os, Rh, Re and Cu, the organic metal compound is a compound in which a metal atom is combined with an organic group through an oxygen atom, the compound in which the metal atom is combined with organic group through the oxygen atom is acetylacetonato, dipivaloylmethanato, alkoxide, hexafluoroacetylacetonato, pentafluoropropanoylpivaloylmethanato or a derivative thereof of any one of the metals selected from the group consisting of Ru, Pt, Ir, Pd, Os, Rh, Re and Cu, the compound in which the metal atom is combined with the organic group through the oxygen atom is a dipivaloylmethanato group compound of any one of Ru, Pt, Ir and Cu, the organic metal compound is cyclopentadienyl or a derivative thereof of any of the metal selected from the group consisting of Ru, Pt, Ir, Pd, Os, Rh, Re and Cu. Therefore, an electrode and a device wiring of metal or conductive oxide having excellent properties can be formed due to a stable supply of a material gas, a capacitor electrode of complicated shape can be formed due to an improvement in the coverage property at film forming, and an electrode film can be obtained, that show a favorable affinity with the foundation material. And due to the improvements in the long-term stability of the material itself and the coverage property at the film forming, it is possible to form a capacitor electrode of complicated shape. It is further possible to form a film of a complex organic metal oxide or the like.

And an electrode film formed by employing it is the film which has a resistance as low as the natural resistance of the metal or the conductive oxide, and its favorable affinity to foundation material enables it to realize a capacitor for a various memory and an electronic device having excellent properties.

Since a wiring film for an other electronic device is formed by employing the CVD material of the present invention, they become wiring films having a resistance as low as the natural resistance of the metal and the conductive oxide, and the favorable affinity to foundation material effects it to realize wiring for various semiconductor devices such as wiring of capacitor or wiring of electronic device having excellent properties.

What we claimed is:

1. A liquid chemical vapor deposition (CVD) source material for forming an electrode including at least one organometallic compound of a platinum group metal dissolved in tetrahydrofuran and having a moisture content of not more than 200 ppm, wherein the compound is selected from the group consisting of acetylacetonato, dipivaloylmethanato, alkoxide, hexafluoroacetylacetonato, and pentafluoropropanoylpivaloylmethanato compounds of a metal selected from the group consisting of Ru, Pt, Ir, Pd, Os, Rh, and Re and derivatives thereof.

2. An electrode for a capacitor which is formed with the CVD source material for forming an electrode of claim 1.

3. A semiconductor device or a wiring film which is formed with the CVD source material for forming an electrode of claim 1.

4. The CVD source material for forming an electrode of claim 1, wherein the organometallic compound is a dipivaloylmethanato complex of ruthenium.

5. The CVD source material for forming an electrode of claim 1, wherein the organometallic compound is a hexafluoroacetylacetonato complex of iridium.

6. A liquid chemical vapor deposition (CVD) source material for forming an electrode including at least one organometallic compound of a platinum group metal dissolved in a mixture of solvents including tetrahydrofuran and having a moisture content of not more than 200 ppm, wherein the compound is selected from the group consisting of acetylacetonato, dipivaloylmethanato, alkoxide, hexafluoroacetylacetonato, and pentafluoropropanoylpivaloylmethanato compounds of a metal selected from the group consisting of Ru, Pt, Ir, Pd, Os, Rh, and Re and derivatives thereof.

7. An electrode for a capacitor which is formed with the CVD source material for forming an electrode of claim 6.

8. A semiconductor device or a wiring film which is formed with the CVD source material for forming an electrode of claim 6.

9. A liquid chemical vapor deposition (CVD) source material for forming an electrode including at least one organometallic cyclopentadienyl compound or a derivative thereof of a metal selected from the group consisting of Ru, Pt, Ir, Pd, Os, Rh, and Re dissolved in tetrahydrofuran and having a moisture content not exceeding 200 ppm.

10. A liquid chemical vapor deposition (CVD) source material for forming an electrode including at least one organometallic cyclopentadienyl compound or a derivative thereof of a metal selected from the group consisting of Ru, Pt, Ir, Pd, Os, Rh, and Re dissolved in a solvent containing tetrahydrofuran and having a moisture content not exceeding 200 ppm.

* * * * *